(12) United States Patent
Kim et al.

(10) Patent No.: US 12,135,584 B2
(45) Date of Patent: Nov. 5, 2024

(54) PROTECTIVE COVER FOR FOLDABLE ELECTRONIC DEVICE

(71) Applicant: Samsung Electronics Co., Ltd., Gyeonggi-do (KR)

(72) Inventors: Eunsoo Kim, Gyeonggi-do (KR); Junyong Song, Gyeonggi-do (KR); Junghyun Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 268 days.

(21) Appl. No.: 17/726,662

(22) Filed: Apr. 22, 2022

(65) Prior Publication Data

US 2022/0240637 A1    Aug. 4, 2022

Related U.S. Application Data

(63) Continuation of application No. PCT/KR2020/014461, filed on Oct. 22, 2020.

(30) Foreign Application Priority Data

Oct. 22, 2019  (KR) .......................... 10-2019-0131376

(51) Int. Cl.
*G06F 1/16* (2006.01)
*H04B 1/3888* (2015.01)
(Continued)

(52) U.S. Cl.
CPC ......... *G06F 1/1628* (2013.01); *H04B 1/3888* (2013.01); *H04M 1/0216* (2013.01);
(Continued)

(58) Field of Classification Search
CPC .................................................... G06F 1/1628
See application file for complete search history.

(56) References Cited

U.S. PATENT DOCUMENTS

| | | | | |
|---|---|---|---|---|
| 5,607,054 A | * | 3/1997 | Hollingsworth | ...... G06F 1/1628 206/320 |
| 8,724,300 B2 | * | 5/2014 | Smith | ................... G06F 1/1628 361/679.01 |

(Continued)

FOREIGN PATENT DOCUMENTS

| | | |
|---|---|---|
| JP | 2018-196081 A | 12/2018 |
| KR | 2002-0034664 A | 5/2002 |

(Continued)

OTHER PUBLICATIONS

Korean Office Action dated Apr. 23, 2024.

*Primary Examiner* — Nidhi Thaker
(74) *Attorney, Agent, or Firm* — Cha & Reiter, LLC

(57) ABSTRACT

A protective cover for a foldable electronic device is disclosed, including a first portion configured to couple to at least part of a first housing of the electronic device, a second portion configured to couple to at least part of a second housing of the electronic device, and a connecting portion configured to cover at least part of a hinge housing of the electronic device, the connecting portion formed between the first portion and the second portion, wherein the hinge housing is connected with the first housing and the second housing such that the first housing and the second housing are foldable according to a folding axis formed therebetween, and wherein the connecting portion includes a core layer, at least a portion of which has a curvature corresponding to a curved area of the hinge housing.

18 Claims, 10 Drawing Sheets

(51) Int. Cl.
*H04M 1/02* (2006.01)
*H05K 5/00* (2006.01)
*H05K 5/02* (2006.01)

(52) U.S. Cl.
CPC ........ *H04M 1/0268* (2013.01); *H05K 5/0013* (2013.01); *H05K 5/0226* (2013.01); *H04M 1/0202* (2013.01)

(56) References Cited

U.S. PATENT DOCUMENTS

| | | | | |
|---|---|---|---|---|
| 9,215,303 | B2* | 12/2015 | Nyholm | G06F 1/1603 |
| 9,329,630 | B2* | 5/2016 | Lauder | H01F 7/0205 |
| 9,432,071 | B2 | 8/2016 | An | |
| 9,654,165 | B2* | 5/2017 | Cho | H04B 1/3888 |
| 9,710,022 | B2* | 7/2017 | Lee | G06F 1/1683 |
| 9,715,254 | B2* | 7/2017 | Mori | G06F 1/1624 |
| 9,778,705 | B2* | 10/2017 | Esmaeili | H01R 13/2407 |
| 9,883,583 | B2 | 1/2018 | Cousins et al. | |
| 9,943,151 | B2* | 4/2018 | Fenton | A45C 11/00 |
| 10,064,298 | B2* | 8/2018 | Cavenagh | G06F 1/1647 |
| 10,074,469 | B2* | 9/2018 | Scales | H01F 7/021 |
| 10,292,285 | B2 | 5/2019 | Cavenagh et al. | |
| 10,314,185 | B2 | 6/2019 | Cavenagh et al. | |
| 10,362,670 | B2 | 7/2019 | Cousins et al. | |
| 10,530,913 | B2 | 1/2020 | Park et al. | |
| 10,613,586 | B2* | 4/2020 | Yamazaki | H10K 77/111 |
| 11,147,174 | B2 | 10/2021 | Cavenagh et al. | |
| 11,493,960 | B2* | 11/2022 | Moon | G06F 3/0208 |
| 11,675,440 | B2* | 6/2023 | Ishihara | D06N 3/0059 |
| | | | | 345/168 |
| 11,812,831 | B1* | 11/2023 | Leith | B32B 5/26 |
| 2008/0302687 | A1* | 12/2008 | Sirichai | A45F 5/02 |
| | | | | 206/320 |
| 2012/0037285 | A1* | 2/2012 | Diebel | G06F 1/1626 |
| | | | | 206/320 |
| 2012/0287562 | A1* | 11/2012 | Wu | G06F 1/1662 |
| | | | | 361/679.01 |
| 2012/0293953 | A1* | 11/2012 | Wu | A45C 11/00 |
| | | | | 361/679.56 |
| 2013/0242490 | A1* | 9/2013 | Ku | G06F 1/1626 |
| | | | | 361/679.56 |
| 2014/0071607 | A1* | 3/2014 | Frinak | G06F 1/1624 |
| | | | | 361/679.09 |
| 2015/0212588 | A1* | 7/2015 | Fujioka | G06F 3/0219 |
| | | | | 345/168 |
| 2015/0230570 | A1* | 8/2015 | Kim | H04M 1/185 |
| | | | | 150/139 |
| 2015/0333789 | A1 | 11/2015 | An | |
| 2015/0335115 | A1* | 11/2015 | Kim | A45C 11/00 |
| | | | | 224/191 |
| 2017/0060192 | A1* | 3/2017 | Cousins | H05K 1/028 |
| 2017/0068281 | A1* | 3/2017 | Smith | G06F 1/1669 |
| 2018/0139857 | A1* | 5/2018 | Cavenagh | G06F 1/1686 |
| 2018/0168027 | A1 | 6/2018 | Cousins et al. | |
| 2019/0132432 | A1 | 5/2019 | Park et al. | |
| 2020/0301480 | A1* | 9/2020 | Miller | G06F 1/1662 |

FOREIGN PATENT DOCUMENTS

| | | |
|---|---|---|
| KR | 10-1269070 B1 | 5/2013 |
| KR | 10-1356236 B1 | 1/2014 |
| KR | 10-2014-0093776 A | 7/2014 |
| KR | 20-2014-0005210 U | 10/2014 |
| KR | 10-2015-0130842 A | 11/2015 |
| KR | 10-1682491 B1 | 11/2016 |
| KR | 10-2017-0100243 A | 9/2017 |
| KR | 20-2019-0000003 U | 1/2019 |
| KR | 10-1956481 B1 | 3/2019 |

* cited by examiner

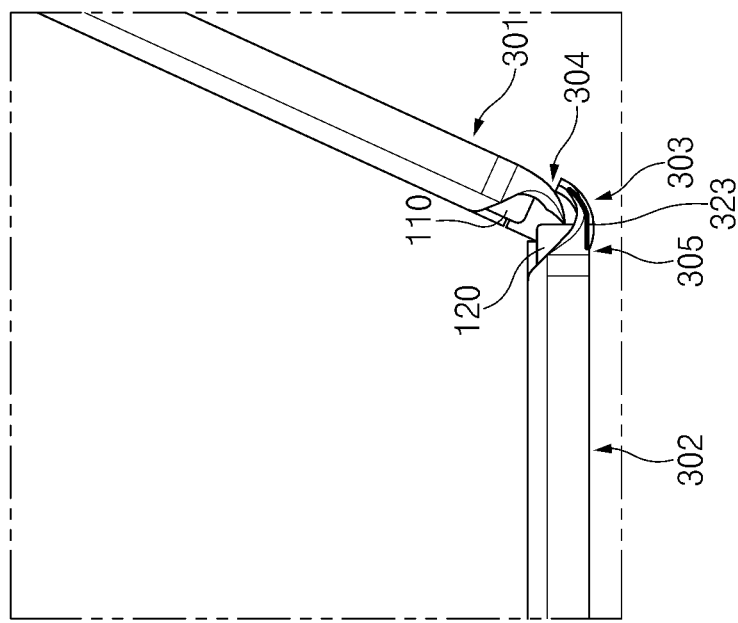
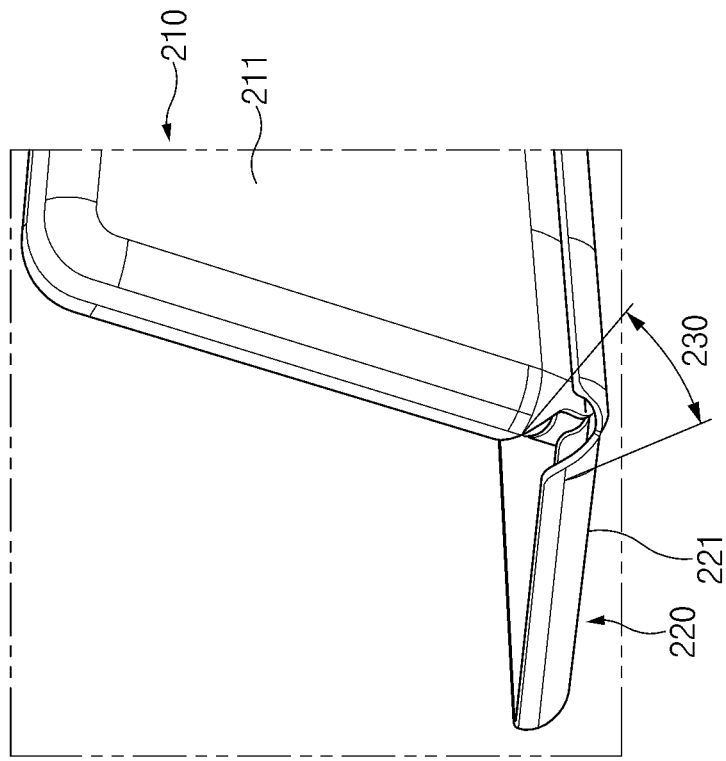
FIG.8A
FIG.8B

PROTECTIVE COVER FOR FOLDABLE ELECTRONIC DEVICE

CROSS-REFERENCE TO RELATED APPLICATION(S)

This application is a continuation of International Application No. PCT/KR2020/014461, which was filed on Oct. 22, 2020 and claims priority to Korean Patent Application No. 10-2019-0131376, filed on Oct. 22, 2019 in the Korean Intellectual Property Office, the disclosures of which are incorporated by reference herein their entirety.

BACKGROUND

Technical Field

Embodiments of the disclosure described herein relate to protective covers for electronic devices, and, more particularly, to a foldable cover for a foldable electronic device.

Description of Related Art

A protective cover for an electronic device may surround a portion of an electronic device excepting the display. The protective cover may serve to protect the electronic device from external impacts.

A foldable electronic device may include a flexible display, a portion of which may be deformable to cause the display to be flat or curved. The foldable electronic device may include a first housing coupled to one side of a bendable area of the flexible display, and a second housing coupled to an opposite side of the bendable area of the flexible display. The foldable electronic device may include a hinge structure that foldably connects the first housing and the second housing. A hinge housing may cover the hinge structure.

The foldable electronic device may be folded such that the first housing and the second housing are disposed to face one another (i.e., a folded state) or to both face a same direction (i.e., a fully-opened or flat state). The hinge housing may be housed in the first housing and the second housing in the flat state, and may be at least partly exposed to an external environment in the folded state.

A protective cover may be implemented using two cover members that are separately coupled to the first housing and the second housing, respectively, without covering the hinge housing. The two cover members may be opened towards the hinge housing, and therefore cannot entirely cover and protect the respective housings.

SUMMARY

Embodiments of the disclosure provide an integrated protective cover for covering a hinge housing of a foldable electronic device, together with a first housing and a second housing.

A protective cover for protecting an electronic device according to embodiments of the disclosure includes a first portion configured to couple to at least part of a first housing of the electronic device, a second portion configured to couple to at least part of a second housing of the electronic device, and a connecting portion configured to cover at least part of a hinge housing of the electronic device, the connecting portion formed between the first portion and the second portion, wherein the hinge housing is connected with the first housing and the second housing such that the first housing and the second housing are foldable according to a folding axis formed therebetween, and wherein the connecting portion includes a core layer, at least a portion of which has a curvature corresponding to a curved area of the hinge housing.

A protective cover for an electronic device according to embodiments of the disclosure includes: a first rigid area configured to attach to one portion of the electronic device, a second rigid area configured to attach to another portion of the electronic device, a third rigid area formed between the first rigid area and the second rigid area, a first flexible area connecting the first rigid area and the third rigid area, and a second flexible area connecting the second rigid area and the third rigid area.

According to certain embodiments of the disclosure, the protective cover may cover the hinge housing of the foldable electronic device, thereby protecting the hinge housing from damage (e.g., scratches, impacts, etc.). According to certain embodiments of the disclosure, the protective cover may be integrally formed and thus firmly coupled to the electronic device.

In addition, the disclosure may provide various effects that may be directly or indirectly recognized.

BRIEF DESCRIPTION OF THE DRAWINGS

FIGS. 8A and 8B are a view illustrating a table mode of the protective cover according to an embodiment.

With regard to description of the drawings, identical or similar reference numerals may be used to refer to identical or similar components.

DETAILED DESCRIPTION

Hereinafter, certain embodiments of the disclosure may be described with reference to accompanying drawings. Accordingly, those of ordinary skill in the art will recognize that modification, equivalent, and/or alternative on the certain embodiments described herein can be variously made without departing from the disclosure.

Figure 1:
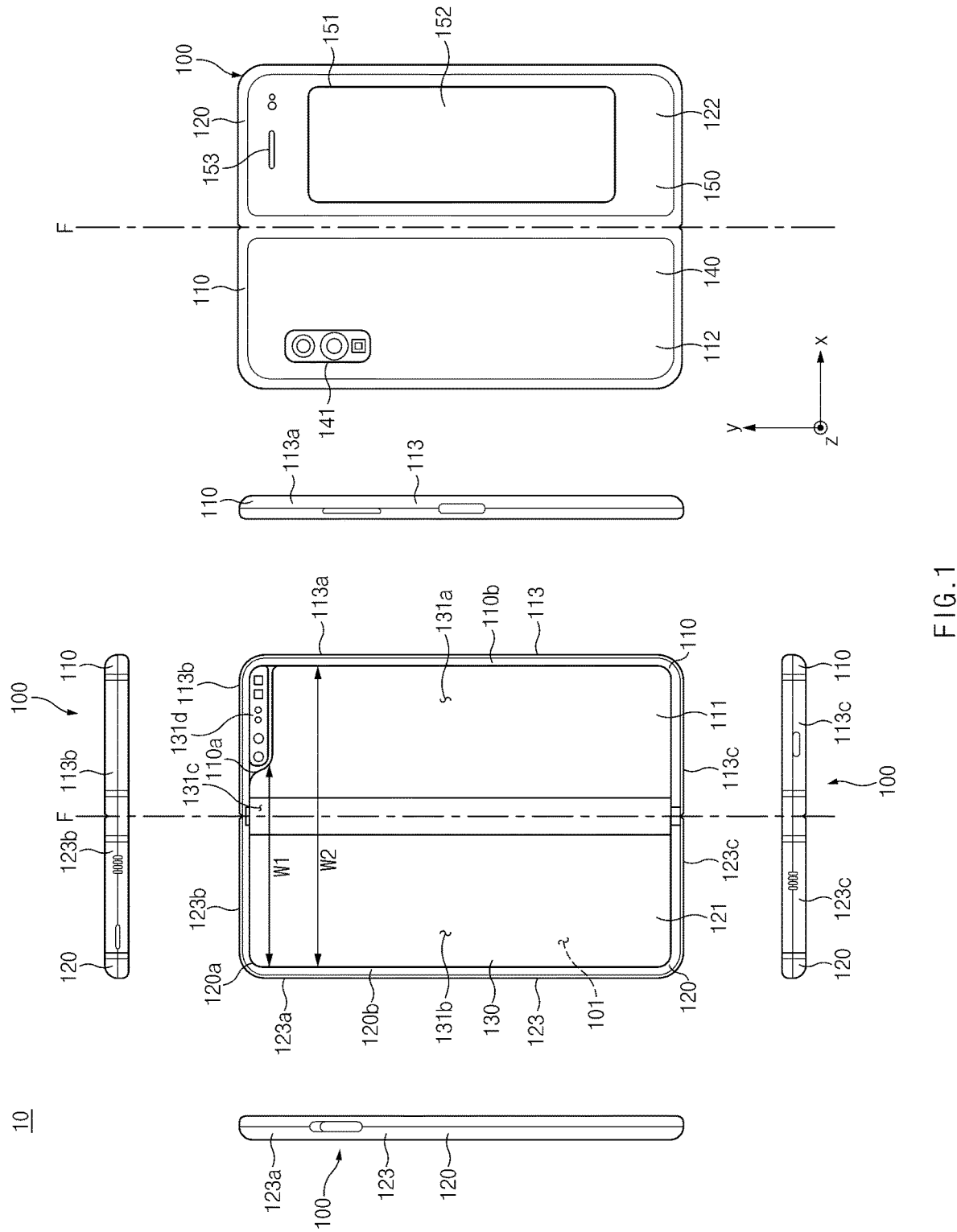
FIG. 1 is a view illustrating a flat state of an electronic device according to certain embodiments of the disclosure.
Figure 2:
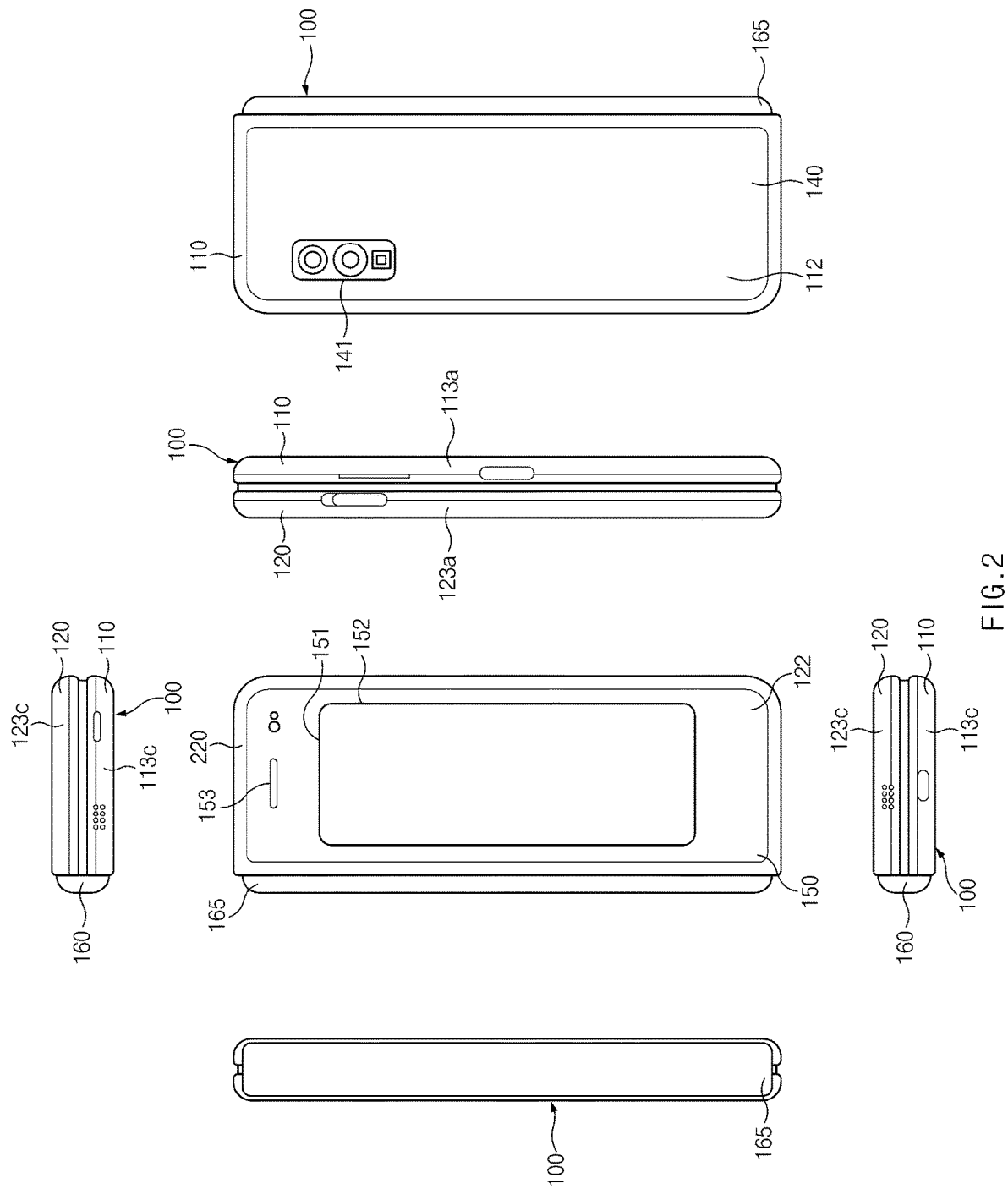
FIG. 2 is a view illustrating a folded state of the electronic device of FIG. 1 according to certain embodiments of the disclosure.

FIG. 1 is a view illustrating a flat state of an electronic device according to certain embodiments of the disclosure. FIG. 2 is a view illustrating a folded state of the electronic device of FIG. 1 according to certain embodiments of the disclosure.

Referring to FIG. 1, the electronic device 100 may include a pair of housing structures 110 and 120 (e.g., foldable housing structures) rotatably coupled through a hinge structure (e.g., a hinge structure 164 of FIG. 3) so as to be foldable relative to each other, a hinge housing (e.g., a hinge housing 165 of FIG. 2) covering foldable portions of the pair of housing structures 110 and 120, and a display 130 (e.g., a flexible display or a foldable display) disposed in the space formed by the pair of housing structures 110 and 120. In this disclosure, the surface on which the display 130 is disposed may be defined as the front surface of the electronic device 100, and the surface facing away from the front surface may be defined as the rear surface of the electronic device 100. Furthermore, the surface surrounding the space between the front surface and the rear surface may be defined as the side surface of the electronic device 100.

In an embodiment, the pair of housing structures 110 and 120 may include the first housing structure 110 including a sensor area 131d, the second housing structure 120, a first back cover 140, and a second back cover 150. The pair of housing structures 110 and 120 of the electronic device 100 are not limited to the form and the coupling illustrated in FIGS. 1 and 2 and may be implemented by a combination and/or coupling of other shapes or components. For example, in another embodiment, the first housing structure 110 and the first back cover 140 may be integrally formed with each other, and the second housing structure 120 and the second back cover 150 may be integrally formed with each other.

According to an embodiment, the first housing structure 110 and the second housing structure 120 may be disposed on opposite sides with respect to a folding axis (an axis F) and may be formed in shapes that are entirely symmetrical to each other with respect to the folding axis (the axis F). According to an embodiment, the angle or distance formed by the first housing structure 110 and the second housing structure 120 may vary depending on whether the electronic device 100 is in a flat state (or, a closing state), a folded state, or an intermediate state. According to an embodiment, unlike the second housing structure 120, the first housing structure 110 may additionally include the sensor area 131d in which various sensors are disposed, but may have a mutually symmetrical shape in the other area. According to another embodiment, the sensor arrangement area 131d may be additionally disposed in, or replaced with, at least a partial area of the second housing structure 120.

In an embodiment, in a flat state of the electronic device 100 (i.e., when the electronic device 100 is unfolded), the first housing structure 110 may be connected to the hinge structure (e.g., the hinge structure 164 of FIG. 3) and may include a first surface 111 disposed to face toward the front surface of the electronic device 100, a second surface 112 facing away from the first surface 111, and a first side member 113 surrounding at least a portion of the space between the first surface 111 and the second surface 112. In an embodiment, the first side member 113 may include a first side surface 113a disposed parallel to the folding axis (the axis F), a second side surface 113b extending from one end of the first side surface 113a in a direction perpendicular to the folding axis, and a third side surface 113c extending from an opposite end of the first side surface 113a in the direction perpendicular to the folding axis (the axis F).

In an embodiment, in the flat state of the electronic device 100, the second housing structure 120 may be connected with the hinge structure (e.g., the hinge structure 164 of FIG. 3) and may include a third surface 121 disposed to face toward the front surface of the electronic device 100, a fourth surface 122 facing away from the third surface 121, and a second side member 123 surrounding at least a portion of the space between the third surface 121 and the fourth surface 122. In an embodiment, the second side member 123 may include a fourth side surface 123a disposed parallel to the folding axis (the axis F), a fifth side surface 123b extending from one end of the fourth side surface 123a in a direction perpendicular to the folding axis (the axis F), and a sixth side surface 123c extending from an opposite end of the fourth side surface 123a in the direction perpendicular to the folding axis (the axis F). In an embodiment, the third surface 121 may face the first surface 111 in the folded state.

In an embodiment, the electronic device 100 may include a recess 101 for accommodating the display 130, through a structural shape coupling of the first housing structure 110 and the second housing structure 120. The recess 101 may have substantially the same size as the display 130. In an embodiment, due to the presence of the sensor area 131d, the recess 101 may have two or more different widths in the direction perpendicular to the folding axis (the axis F). For example, the recess 101 may have a first width W1 between a first portion 120a of the second housing structure 120 that is parallel to the folding axis (the axis F) and a first portion 110a of the first housing structure 110 that is formed on the periphery of the sensor area 131d and a second width W2 formed by a second portion 120b of the second housing structure 120 and a second portion 110b of the first housing structure 110 that does not correspond to the sensor area 131d and that is parallel to the folding axis (the axis F). In this case, the second width W2 may be formed to be longer than the first width W1. For example, the recess 101 may be formed to have the first width W1 between the first portion 110a of the first housing structure 110 and the first portion 120a of the second housing structure 120 that have mutually asymmetrical shapes and the second width W2 between the second portion 110b of the first housing structure 110 and the second portion 120b of the second housing structure 120 that have mutually symmetrical shapes. In an embodiment, the first portion 110a and the second portion 110b of the first housing structure 110 may be formed to have different distances from the folding axis (the axis F). The width of the recess 101 is not limited to the illustrated example. In certain embodiments, the recess 101 may have two or more different widths due to the form of the sensor area 131d or the asymmetrically-shaped portions of the first housing structure 110 and the second housing structure 120.

In an embodiment, at least a portion of the first housing structure 110 and at least a portion of the second housing structure 120 may be formed of a metallic material or a non-metallic material, selected for having a stiffness of sufficient magnitude to support the display 130.

In an embodiment, the sensor area 131d may be formed to have a predetermined area adjacent to one corner of the first housing structure 110. However, the arrangement, shape, or size of the sensor area 131d is not limited to the illustrated example. For example, in another embodiment, the sensor area 131d may be provided in another corner of the first housing structure 110 or in any area between the upper corner and the lower corner of the first housing structure 110. In another embodiment, the sensor area 131d may be disposed in at least a partial area of the second housing structure 120. In another embodiment, the sensor area 131d may be disposed to extend to the first housing structure 110 and the second housing structure 120. In an embodiment, the electronic device 100 may include components that perform various functions and that are disposed to be exposed on the front surface of the electronic device 100 though the sensor area 131d or one or more openings formed in the sensor area 131d. In certain embodiments, the components may include, for example, at least one of a front camera device, a receiver, a proximity sensor, an illuminance sensor, an iris recognition sensor, an ultrasonic sensor, or an indicator.

In an embodiment, the first back cover 140 may be disposed on the second surface 112 of the first housing structure 110, and may have a substantially rectangular periphery. In an embodiment, at least a portion of the periphery may be surrounded by the first housing structure 110. Similarly, the second back cover 150 may be disposed on the fourth surface 122 of the second housing structure 120, and at least a portion of the periphery of the second back cover 150 may be surrounded by the second housing structure 120.

In the illustrated embodiment, the first back cover 140 and the second back cover 150 may have substantially symmetrical shapes with respect to the folding axis (the axis F). In another embodiment, the first back cover 140 and the second back cover 150 may include various different shapes. In another embodiment, the first back cover 140 may be integrally formed with the first housing structure 110, and the second back cover 150 may be integrally formed with the second housing structure 120.

In an embodiment, the first back cover 140, the second back cover 150, the first housing structure 110, and the second housing structure 120 may provide, through a mutually coupled structure, a space in which various components (e.g., a printed circuit board, an antenna module, a sensor module, or a battery) of the electronic device 100 are disposed. In an embodiment, one or more components may be disposed, or visually exposed, on the rear surface of the electronic device 100. For example, one or more components or sensors may be visually exposed through a first rear area 141 of the first back cover 140. In certain embodiments, the sensors may include a proximity sensor, a rear camera device, and/or a flash. In another embodiment, at least a portion of a sub-display 152 may be visually exposed through a second rear area 151 of the second back cover 150. In another embodiment, the electronic device 100 may include a speaker module 153 disposed through at least a partial area of the second back cover 150.

The display 130 may be disposed over the space formed by the pair of housing structures 110 and 120. For example, the display 130 may be mounted in the recess 101 formed by the pair of housing structures 110 and 120 and may be disposed to occupy substantially the entire front surface of the electronic device 100. Accordingly, the front surface of the electronic device 100 may include the display 130, and a partial area (e.g., a peripheral area) of the first housing structure 110 and a partial area (e.g., a peripheral area) of the second housing structure 120 that are adjacent to the display 130. In an embodiment, the rear surface of the electronic device 100 may include the first back cover 140, a partial area (e.g., a peripheral area) of the first housing structure 110 that is adjacent to the first back cover 140, the second back cover 150, and a partial area (e.g., a peripheral area) of the second housing structure 120 that is adjacent to the second back cover 150.

In an embodiment, the display 130 may refer to a flexible display, at least a partial area of which is deformable to be flat or curved. In an embodiment, the display 130 may include a folding area 131c, a first area 131a disposed on one side of the folding area 131c (e.g., on the right side of the folding area 131c), and a second area 131b disposed on an opposite side of the folding area 131c (e.g., on the left side of the folding area 131c). For example, the first area 131a may be disposed on the first surface 111 of the first housing structure 110, and the second area 131b may be disposed on the third surface 121 of the second housing structure 120. In an embodiment, the division of the display 130 into the areas is illustrative, and the display 130 may be divided into a plurality of areas (e.g., four or more areas, or two areas) depending on the structure or function of the display 130. For example, in the embodiment illustrated in FIG. 1, the areas of the display 130 may be divided from each other by the folding area 131c or the folding axis (the axis F) that extends parallel to the y axis. However, in another embodiment, the display 130 may be divided into areas with respect to a different folding area (e.g., a folding area parallel to the x-axis) or a different folding axis (e.g., a folding axis parallel to the x-axis). The above-described division of the display 130 into the areas may be merely a physical division by the pair of housing structures 110 and 120 and the hinge structure (e.g., the hinge structure 164 of FIG. 3), and one full screen may be displayed on the display 130 substantially through the pair of housing structures 110 and 120 and the hinge structure (e.g., the hinge structure 164 of FIG. 3). In an embodiment, the first area 131a and the second area 131b may have shapes that are entirely symmetrical to each other with respect to the folding area 131c. However, unlike the second area 131b, the first area 131a may include a notch area (e.g., a notch area 133 of FIG. 3) that is cut depending on the presence of the sensor area 131d, and in the other area, the first area 131a may have a shape symmetrical to the second area 131b. For example, the first area 131a and the second area 131b may include portions having shapes symmetrical to each other and portions having shapes asymmetrical to each other.

Figure 3:
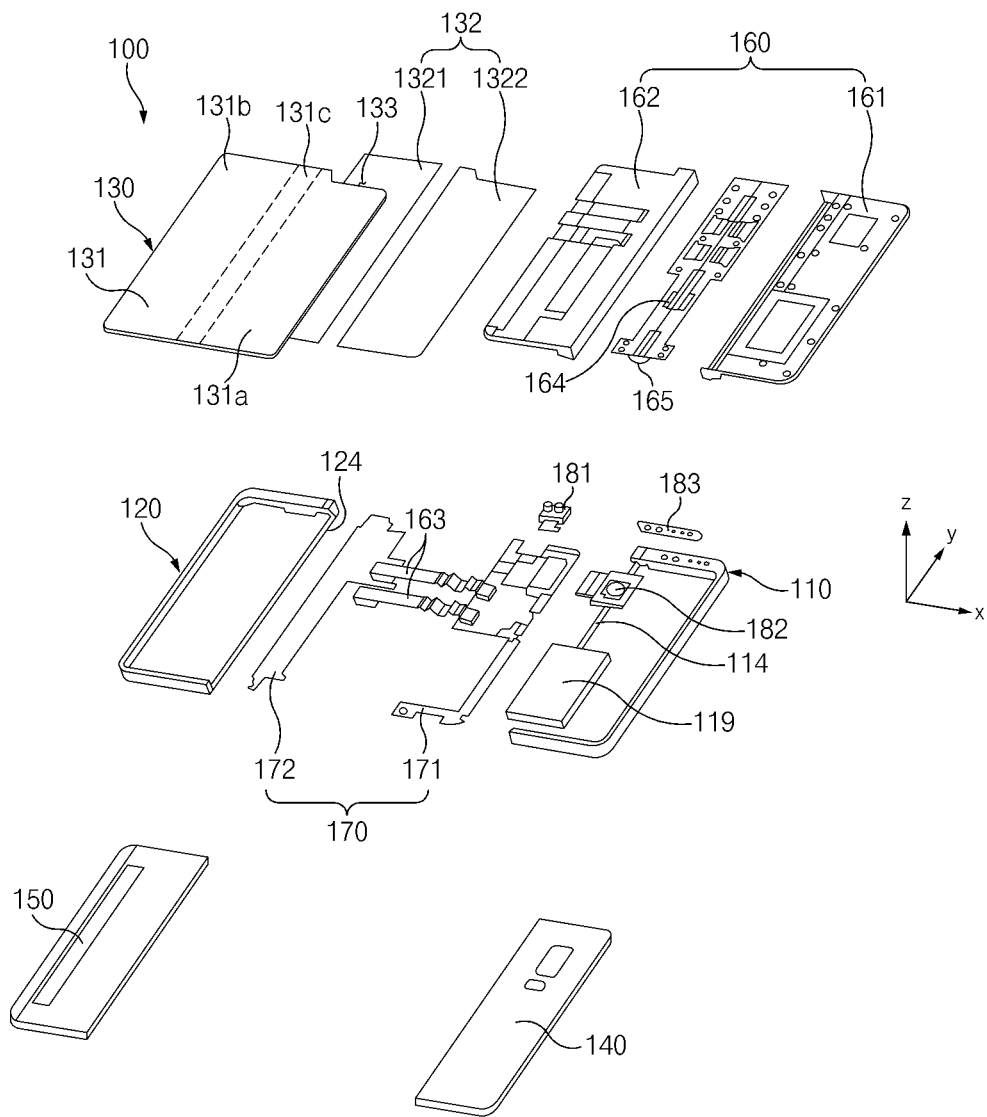
FIG. 3 is an exploded perspective view of the electronic device according to certain embodiments of the disclosure.

Referring to FIG. 2, the hinge housing 165 may be disposed between the first housing structure 110 and the second housing structure 120 and may be configured to hide or stow an internal component (e.g., the hinge structure 164 of FIG. 3). In an embodiment, the hinge housing 165 may be hidden by a portion of the first housing structure 110 and a portion of the second housing structure 120, or may be exposed to the outside, depending on an operational state (a flat state or a folded state) of the electronic device 100.

For example, when the electronic device 100 is disposed in a flat state as illustrated in FIG. 1, the hinge housing 165 may not be exposed by being hidden by and/or stowed within the first housing structure 110 and the second housing structure 120. In another example, when the electronic device 100 is disposed in a folded state (e.g., a completely folded state) as illustrated in FIG. 2, the hinge housing 165 may be exposed to the outside from between the first housing structure 110 and the second housing structure 120. In another example, when the electronic device 100 is in an intermediate state in which the first housing structure 110 and the second housing structure 120 are folded with a certain angle, the hinge housing 165 may be at least partially exposed to the outside of the electronic device 100 from between the first housing structure 110 and the second housing structure 120. In this case, the exposed area may be smaller than that in the completely folded state. In an embodiment, the hinge housing 165 may include a curved surface.

Hereinafter, operations of the first housing structure 110 and the second housing structure 120 and the areas of the display 130 depending on an operational state (e.g., a flat state or a folded state) of the electronic device 100 will be described.

In an embodiment, when the electronic device 100 is in a flat state (e.g., the state of FIG. 1), the first housing structure 110 and the second housing structure 120 may form an angle of 180 degrees, and the first area 131a and the second area 131*b* of the display 130 may be disposed to face the same direction. Furthermore, the folding area 131*c* may form the same plane as the first area 131*a* and the second area 131*b*. In another embodiment, when the electronic device 100 is in the flat state, the first housing structure 110 and the second housing structure 120 may rotate relative to each other through an angle of 360 degrees and may be oppositely folded such that the second surface 112 and the fourth surface 122 face each other.

In an embodiment, when the electronic device 100 is disposed in a folded state (e.g., the state of FIG. 2), the first housing structure 110 and the second housing structure 120 may be disposed to face each other. The first area 131*a* and the second area 131*b* of the display 130 may face each other while forming a narrow angle (e.g., between 0 degrees and 10 degrees). At least a portion of the folding area 131*c* may be formed to be a curved surface having a certain curvature.

In an embodiment, when the electronic device 100 is in an intermediate state (e.g., disposed partly between folded and unfolded states), the first housing structure 110 and the second housing structure 120 may be disposed at a certain angle. The first area 131*a* and the second area 131*b* of the display 130 may form an angle that is larger than that in the folded state and smaller than that in the flat state. At least a portion of the folding area 131*c* may be formed to be a curved surface having a certain curvature. In this case, the curvature may be smaller than that in the folded state.

FIG. 3 is an exploded perspective view of the electronic device according to certain embodiments of the disclosure.

Referring to FIG. 3, in an embodiment, the electronic device 100 may include the display 130, a support member assembly 160, at least one printed circuit board 170, the first housing structure 110, the second housing structure 120, the first back cover 140, and the second back cover 150. In this disclosure, the display (the display unit) 130 may be referred to as the display module or the display assembly.

The display 130 may include a display panel 131 (e.g., a flexible display panel) and at least one plate or layer 132 on which the display panel 131 is seated. In an embodiment, the plate 132 may be disposed between the display panel 131 and the support member assembly 160. The display panel 131 may be disposed on at least a portion of one surface of the plate 132. The plate 132 may include a first plate 1321 and a second plate 1322 divided from each other with respect to the hinge structure 164. The plate 132 may include at least one member that cannot be folded together when the first housing structure 110 and the second housing structure 120 are folded and/or unfolded with respect to the hinge structure 164. The plate 132 may include at least one subsidiary material layer (e.g., a graphite member) and/or at least one conductive plate (e.g., a Cu sheet) disposed on the rear surface of the display panel 131. In an embodiment, the plate 132 may be formed in a shape corresponding to the display panel 131. For example, a partial area of the first plate 1321 may be formed in a shape corresponding to the notch area 133 of the display panel 131.

The support member assembly 160 may include a first support member 161, a second support member 162, the hinge structure 164 disposed between the first support member 161 and the second support member 162, the hinge housing 165 covering the hinge structure 164 when the hinge structure 164 is viewed from the outside, and at least one wiring member 163 (e.g., a flexible printed circuit board (FPCB)) across the first support member 161 and the second support member 162.

In an embodiment, the support member assembly 160 may be disposed between the plate 132 and the at least one printed circuit board 170. For example, the first support member 161 may be disposed between the first area 131*a* of the display 130 and a first printed circuit board 171. The second support member 162 may be disposed between the second area 131*b* of the display 130 and a second printed circuit board 172.

In an embodiment, at least a portion of the wiring member 163 and at least a portion of the hinge structure 164 may be disposed inside the support member assembly 160. The wiring member 163 may be disposed in a direction (e.g., the x-axis direction) across the first support member 161 and the second support member 162. The wiring member 163 may be disposed in a direction (e.g., the x-axis direction) perpendicular to the folding axis of the folding area 131*c* (e.g., the y-axis or the folding axis F of FIG. 1).

In an embodiment, the at least one printed circuit board 170, as mentioned above, may include the first printed circuit board 171 disposed on one side of the first support member 161 and the second printed circuit board 172 disposed on one side of the second support member 162. The first printed circuit board 171 and the second printed circuit board 172 may be disposed in the space formed by the support member assembly 160, the first housing structure 110, the second housing structure 120, the first back cover 140, and the second back cover 150. Components for implementing various functions of the electronic device 100 may be mounted on the first printed circuit board 171 and the second printed circuit board 172.

In an embodiment, the first housing structure 110 may house the first printed circuit board 171, a battery 119, at least one sensor module 181, or at least one camera module 182 that is disposed in the space formed through the first support member 161. The first housing structure 110 may include a glass window 183 that is disposed in a position corresponding to the notch area 133 of the display 130 and that protects the at least one sensor module 181 and the at least one camera module 182. In an embodiment, the second housing structure 120 may house the second printed circuit board 172 disposed in the space formed through the second support member 162. According to an embodiment, the first housing structure 110 and the first support member 161 may be integrally formed with each other. According to an embodiment, the second housing structure 120 and the second support member 162 may also be integrally formed with each other.

In an embodiment, the first housing structure 110 may include a first rotation support surface 114, and the second housing structure 120 may include a second rotation support surface 124 corresponding to the first rotation support surface 114. The first rotation support surface 114 and the second rotation support surface 124 may include a curved surface corresponding to the curved surface included in the hinge housing 165.

In an embodiment, when the electronic device 100 is in a flat state (e.g., the state of FIG. 1), the first rotation support surface 114 and the second rotation support surface 124 may cover the hinge cover 165 such that the hinge housing 165 is not exposed, or is minimally exposed, on the rear surface of the electronic device 100. In an embodiment, when the electronic device 100 is disposed in a folded state (e.g., the state of FIG. 2), the first rotation support surface 114 and the second rotation support surface 124 may rotate along the curved surface included in the hinge housing 165 such that the hinge housing 165 is maximally exposed on the rear surface of the electronic device 100.

Figure 4:
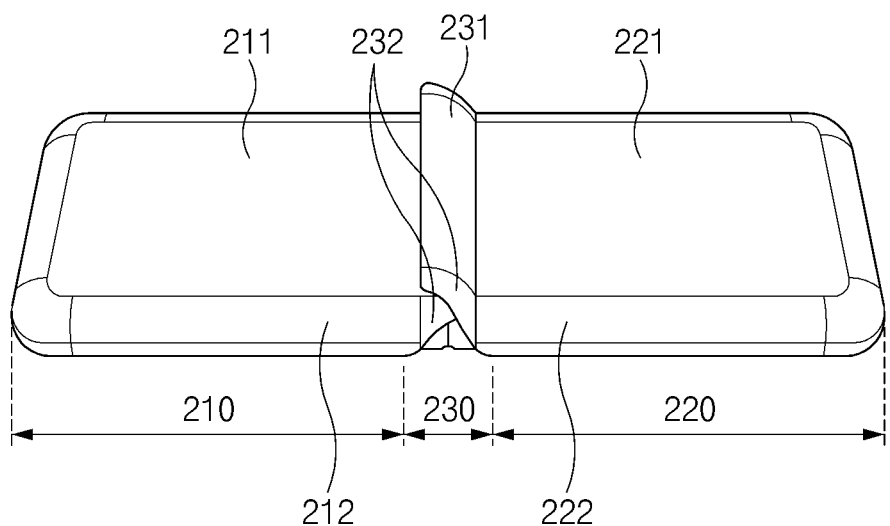
FIG. 4 is a perspective view of a protective cover according to an embodiment.

FIG. 4 is a perspective view of a protective cover according to an embodiment.

In an embodiment, the protective cover 200 may protect the foldable electronic device 100 (hereinafter, referred to as the electronic device). The protective cover 200 may surround at least a portion of the electronic device 100. For example, the protective cover 200 may surround a portion of the front surface (e.g., the peripheral area) through the side surface (e.g., the first side member 113 and the second side member 123 of FIG. 1) from the rear surface of the electronic device (e.g., the second surface 112 and the fourth surface 122 of FIG. 1). The protective cover 200 may include a flexible fabric member and a rigid core member.

The protective cover 200 may include a first portion 210, a second portion 220, and a connecting portion 230.

In an embodiment, the first portion 210 may be coupled to at least a portion of the first housing 110 (e.g., the first housing structure) of the electronic device. The first portion 210 may include a first rear surface area 211 coupled to at least a portion of the second surface 112 of the first housing 110, and a first side surface area 212 coupled to at least a portion of the first side member 113 of the first housing 110. The first rear surface area 211 of the first housing 110 may be formed to be substantially flat. The first side surface area 212 may curvedly extend from the first rear surface area 211. The first portion 210 may be coupled with the first housing 110 such that the first rear surface area 211 and the first side surface area 212 are brought into close contact with the second surface 112 of the first housing 110 and the first side member 113 of the first housing 110, respectively. In certain embodiments, the first rear surface area 211 and the first side surface area 212 are not limited to the shapes illustrated in the drawing, and may be formed to be flat and/or curved to correspond to the shape of the first housing 110 of the electronic device.

In an embodiment, the second portion 220 may be coupled to at least a portion of the second housing 120 (e.g., the second housing structure) of the electronic device. The second portion 220 may include a second rear surface area 221 coupled to at least a portion of the fourth surface 122 of the second housing 120 and a second side surface area 222 coupled to at least a portion of the second side member 123 of the second housing 120. The second rear surface area 221 may be formed to be substantially flat. The second side surface area 222 may curvedly extend from the second rear surface area 221. The second portion 220 may be coupled with the second housing 120 such that the second rear surface area 221 and the second side surface area 222 are brought into close contact with the fourth surface 122 of the second housing 120 and the second side member 123 of the second housing 120, respectively. In certain embodiments, the second rear surface area 221 and the second side surface area 222 are not limited to the shapes illustrated in the drawing and may be formed to be flat and/or curved to correspond to the shape of the second housing 120 of the electronic device.

In an embodiment, the connecting portion 230 may be formed between the first portion 210 and the second portion 220. The connecting portion 230 may include a third rear surface area 231 formed between the first rear surface area 211, and the second rear surface area 221 and a third side surface area 232 formed between the first side surface area 212 and the second side surface area 222. The connecting portion 230 may have a smaller width than the first portion 210 and the second portion 220. For example, the connecting portion 230 may include a structure extending from the first portion 210, such that the width of the structure is decreased from the first portion 210 toward the second portion 220. The connecting portion 230 may further include a structure extending from the second portion 220, such that the width of the structure is decreased from the second portion 220 toward the first portion 210. For example, the third side surface area 232 may have a smaller width than the first side surface area 212 and/or the second side surface area 222.

Figure 5A:
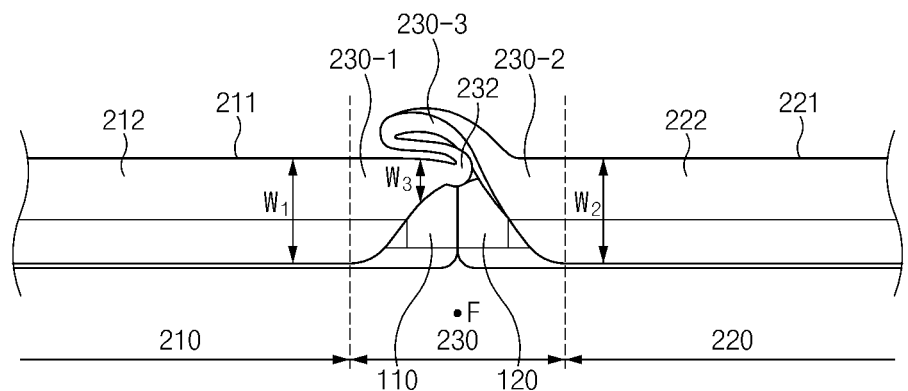
FIGS. 5A and 5B are a side view of the protective cover according to an embodiment.
Figure 5B:
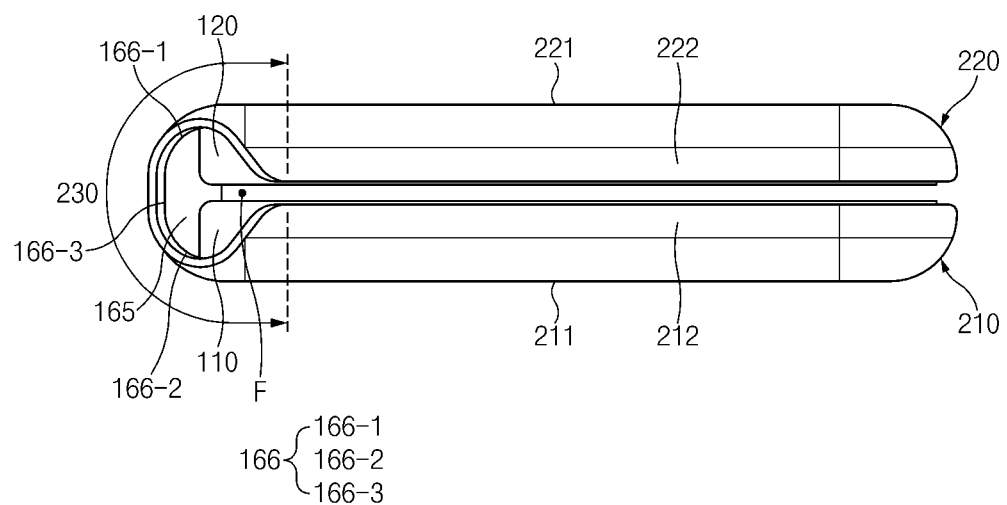

FIGS. 5A and 5B are a side view of the protective cover according to an embodiment. FIG. 5A is a side view of the protective cover in a flat state. FIG. 5B is a side view of the protective cover in a folded state.

In an embodiment, the protective cover 200 may include the first portion 210 in which the first housing 110 is mounted, the second portion 220 in which the second housing 120 is mounted, and the connecting portion 230 that is formed between the first portion 210 and the second portion 220 and that has a smaller width than the first portion 210 and the second portion 220.

In an embodiment, the protective cover 200 may include a flat state and a folded state as a state in which the electronic device is mounted. The flat state may include a state in which the hinge housing 165 of the mounted electronic device is not exposed. The flat state may include a state in which the first rear surface area 211 and the second rear surface area 221 face the same direction.

In an embodiment, the folded state may include a state in which the hinge housing 165 of the mounted electronic device is exposed between the first housing 110 and the second housing 120. The folded state may include a state in which the first rear surface area 211 and the second rear surface area 221 form a predetermined angle therebetween. For example, the folded state may include a fully folded state in which the first rear surface area 211 and the second rear surface area 221 face away from each other.

In the flat state illustrated in FIG. 5A, at least a portion of the connecting portion 230 may not make contact with the first housing 110 and the second housing 120. A portion 3-1 230-1 of the connecting portion 230 that is adjacent to the first portion 210 may be physically coupled to the first housing 110. A portion 3-2 230-2 of the connecting portion 230 that is adjacent to the second portion 220 may be physically coupled to the second housing 120. A portion 3-3 230-3 of the connecting portion 230 that is formed between the portion 3-1 230-1 and the portion 3-2 230-2 may not make physical contact with the first housing 110 and the second housing 120.

In the folded state illustrated in FIG. 5B, the connecting portion 230 may face the hinge housing 165 of the electronic device. The connecting portion 230 may be formed in a shape corresponding to a portion of an outer surface 166 of the hinge housing 165. The outer surface 166 of the hinge housing 165 may include a first curved area 166-1 adjacent to the first housing 110, a second curved area 166-2 adjacent to the second housing 120, and a flat area 166-3 formed between the first curved area 166-1 and the second curved area 166-2. For example, the connecting portion 230 may have a curvature corresponding to the first curved area 166-1 or the second curved area 166-2. The connecting portion 230 may be spaced apart from a portion of the outer surface 166 of the hinge housing 165 by a predetermined gap. In certain embodiments, the outer surface 166 of the hinge housing 165 may be formed of a curved area as a whole without a flat area (e.g., 166-3). In this case, the connecting portion 230 may be formed to be curved to have a curvature corresponding to the curved area.

Referring to FIGS. 5A and 5B, the first portion 210 and the second portion 220 of the protective cover 200 may be coupled so as to be brought into close contact with surfaces of the electronic device irrespective of a change of state of the electronic device. The connecting portion 230 of the protective cover 200 may be deformed depending on the change of state of the electronic device.

Figure 6A:
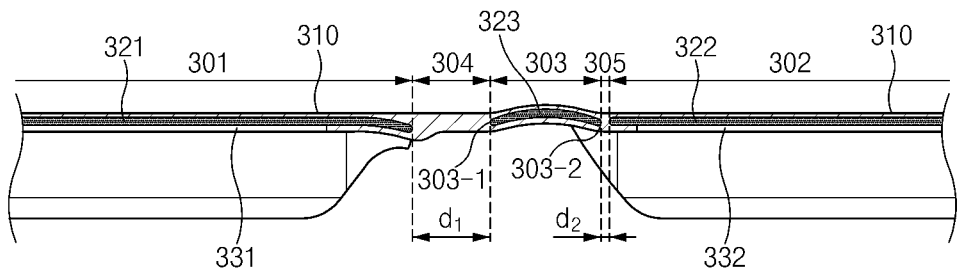
FIGS. 6A, 6B and 6C are a sectional view of the protective cover according to an embodiment.
Figure 6B:
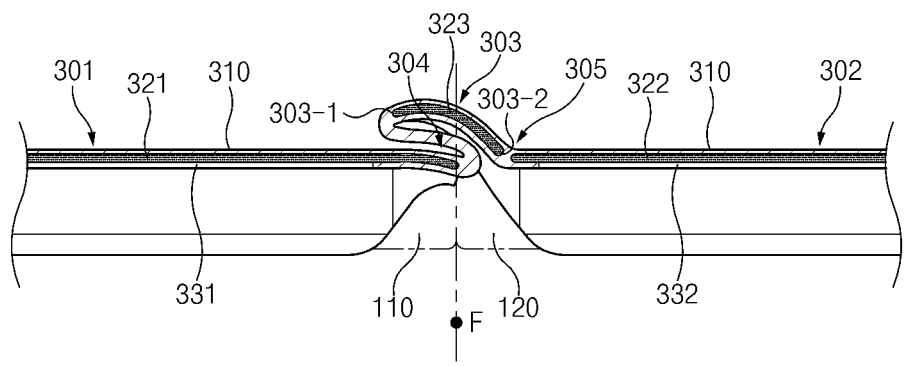
Figure 6C:
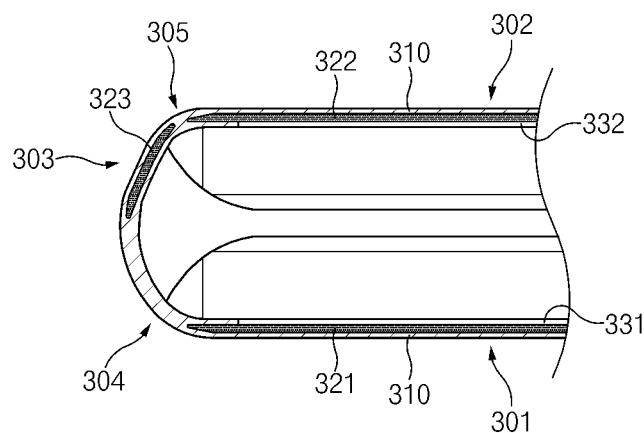

FIGS. 6A, 6B and 6C are a sectional view of the protective cover according to an embodiment. FIG. 6A is a view illustrating a flat state of the protective cover in which the electronic device is not mounted. FIG. 6B is a view illustrating a flat state of the protective cover in which the electronic device is mounted. FIG. 6C is a view illustrating a folded state of the protective cover in which the electronic device is not mounted However, the flat state of the protective cover illustrated in FIG. 6B is not limited to the case in which the electronic device is mounted. For example, FIG. 6B may be understood as illustrating a flat state of the protective cover in which the electronic device is not mounted.

In an embodiment, the protective cover 200 may include a first rigid area 301, a second rigid area 302, a third rigid area 303, a first flexible area 304, and a second flexible area 305.

In certain embodiments, the first rigid area 301 may be included in the first portion 210 illustrated in FIG. 5. The second rigid area 302 may be included in the second portion 220 illustrated in FIG. 5. The third rigid area 303 may be included in the connecting portion 230 illustrated in FIG. 5.

In an embodiment, the protective cover 200 may include a fabric layer 310, core layers 321, 322, and 323, and adhesive layers 331 and 332. The fabric layer 310 may be integrally formed in the rigid areas 301, 302, and 303 and the flexible areas 304 and 305. The core layers 321, 322, and 323 may include the first core layer 321 included in the first rigid area 301, the second core layer 322 included in the second rigid area 302, and the third core layer 323 included in the third rigid area 303. The adhesive layers 331 and 332 may include the first adhesive layer 331 included in the first rigid area 301 and the second adhesive layer 332 included in the second rigid area 302.

In an embodiment, the first rigid area 301 may substantially surround the second surface (e.g., the second surface 112 of FIG. 1) and the first side surface (e.g., the first side member 113 of FIG. 1) of the first housing 110. The first rigid area 301 may remain in a constant predetermined shape, irrespective of disposition in either the flat state or the folded state.

In an embodiment, the first rigid area 301 may include the fabric layer 310, the first core layer 321 at least partially surrounded by the fabric layer 310, and the first adhesive layer 331 attached to the electronic device. The fabric layer 310 may form the outer surface of the first rigid area 301. The fabric layer 310, together with the first adhesive layer 331, may form the inner surface of the first rigid area 301. The first core layer 321 may be formed of a rigid material such that the first rigid area 301 maintains a constant shape. The first core layer 321 may be spaced apart from the third core layer 323 and the second core layer 322 by predetermined gaps. The first core layer 321 may be spaced apart from the third core layer 323 by a first gap d1.

In certain embodiments, the first core layer 321 may include at least one of polycarbonate, urethane, wood, or metal. In certain embodiments, the first adhesive layer 331 may be attached to a surface of the electronic device by providing a frictional force. In certain embodiments, the first adhesive layer 331 may include a suction pad that provides an adhesion force to the surface of the electronic device. In certain embodiments, the first adhesive layer 331 may include an adhesive material.

In an embodiment, the second rigid area 302 may substantially surround the fourth surface (e.g., the fourth surface 122 of FIG. 1) and the second side surface (e.g., the second side member 123 of FIG. 1) of the second housing 120. The second rigid area 302 may remain in a constant predetermined shape in both the flat state and the folded state.

In an embodiment, the second rigid area 302 may include the fabric layer 310, the second core layer 322 at least partially surrounded by the fabric layer 310, and the second adhesive layer 332 attached to the electronic device. The fabric layer 310 may form the outer surface of the second rigid area 302. The fabric layer 310, together with the second adhesive layer 332, may form the inner surface of the second rigid area 302. The second core layer 322 may be formed of a rigid material such that the second rigid area 302 maintains the shape thereof. The second core layer 322 may be spaced apart from the third core layer 323 and the first core layer 321 by predetermined gaps. The second core layer 322 may be spaced apart from the third core layer 323 by a second gap d2. In certain embodiments, the second gap d2 may be 2 mm or less.

In certain embodiments, the second core layer 322 may be formed of at least one of polycarbonate, urethane, wood, or metal. In certain embodiments, the second adhesive layer 332 may be attached to a surface of the electronic device by providing a frictional force. In certain embodiments, the second adhesive layer 332 may include a suction pad that provides an adhesion force to the surface of the electronic device. In certain embodiments, the second adhesive layer 332 may include an adhesive material.

In an embodiment, the third rigid area 303 may be formed between the first flexible area 304 and the second flexible area 305. The third rigid area 303 may remain in a constant predetermined shape in both the flat state and the folded state. In the folded state, at least a portion of the third rigid area 303 may be disposed to face the outer surface 166 of the hinge housing 165.

In an embodiment, the third rigid area 303 may include the fabric layer 310 and the third core layer 323 surrounded by the fabric layer 310. The fabric layer 310 may form the outer surface and the inner surface of the third rigid area 303. The third core layer 323 may be formed of a rigid material such that the third rigid area 303 maintains a constant shape. The third core layer 323 may be spaced apart from the first core layer 321 by the first gap d1 and may be spaced apart from the second core layer 322 by the second gap d2 different from the first gap d1. In certain embodiments, the first gap d1 may be greater than the second gap d2.

In certain embodiments, the third rigid area 303 may include a first end portion 303-1 connected with the first flexible area 304 and a second end portion 303-2 connected with the second flexible area 305. In the flat state, the first end portion 303-1 may be located on one side (e.g., the left side) with respect to the folding axis F, and the second end portion 303-2 may be located on an opposite side (e.g., the right side) with respect to the folding axis F. In the folded state, the first end portion 303-1 and the second end portion 303-2 may be located in the same direction (e.g., on the left side) with respect to the folding axis F. In certain embodiments, the third core layer 323 may be formed to be curved to have a curvature corresponding to a portion (e.g., the curved areas 166-1 and 166-2) of the hinge housing (e.g., the hinge housing 165 of FIG. 5). In the folded state, the third rigid area 303 may be disposed such that the center of curvature substantially coincides with the center of curvature of the curved area of the hinge housing 165.

In an embodiment, the first flexible area 304 may be formed between the first rigid area 301 and the third rigid area 303. The first flexible area 304 may include the fabric layer 310. For example, the first flexible area 304 may be formed of the fabric layer 310. The first flexible area 304 may be bent depending on a change of state of the protective cover 200 to change the position of the third rigid area 303 relative to the first rigid area 301. For example, when viewed in the flat state, the first flexible area 304 may be bent such that the third rigid area 303 further protrudes beyond the first rigid area 301 or the second rigid area 302 in the direction toward the rear surface of the protective cover 200. For example, when viewed in the folded state, the first flexible area 304 may be bent such that a portion of the third rigid area 303 faces the outer surface of the hinge housing 165.

In certain embodiments, when the rear surface of the protective cover 200 is viewed from above, the first flexible area 304 may have a different area from the second flexible area 305. For example, the first flexible area 304 may have a larger area than the second flexible area 305. In certain embodiments, the first flexible area 304 may be bent at least once in the flat state in which the electronic device is mounted.

In an embodiment, the second flexible area 305 may be formed between the second rigid area 302 and the third rigid area 303. The second flexible area 305 may include the fabric layer 310. For example, the second flexible area 305 may be formed of the fabric layer 310 so as to exclude other layers. The second flexible area 305 may be bent depending on a change of state of the protective cover 200 to change the position of the third rigid area 303 relative to the second rigid area 302. For example, when viewed in the flat state, the second flexible area 305 may be bent such that the third rigid area 303 further protrudes beyond the first rigid area 301 or the second rigid area 302 in the direction toward the rear surface of the protective cover 200. For example, when viewed in the folded state, the second flexible area 305 may be bent such that a portion of the third rigid area 303 faces the outer surface of the hinge housing 165.

In certain embodiments, when the rear surface of the protective cover 200 is viewed from above, the second flexible area 305 may have a different area from the first flexible area 304. For example, the second flexible area 305 may have a smaller area than the first flexible area 304. In certain embodiments, the second flexible area 305 may be bent at least once in the flat state in which the electronic device is mounted.

In certain embodiments, in the flat state in which the electronic device is mounted, the first flexible area 304 may be located in the space between the first rigid area 301 and the third rigid area 303. In the flat state in which the electronic device is mounted, the first flexible area 304 may be located in the space between the first core layer 321 and the second core layer 322.

Figure 7A:
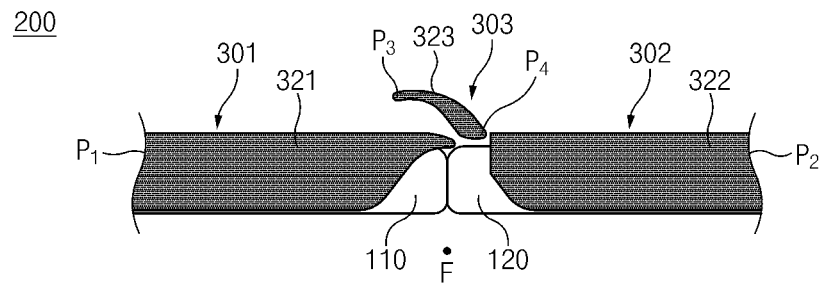
FIGS. 7A, 7B and 7C are a view illustrating core layers depending on states of the protective cover according to an embodiment.
Figure 7B:
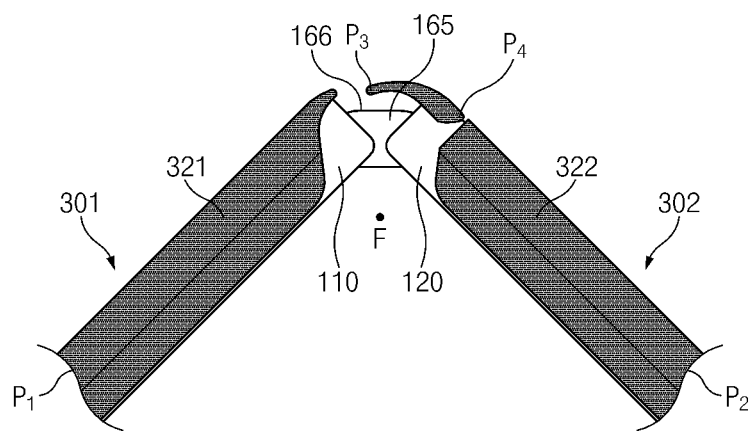
Figure 7C:
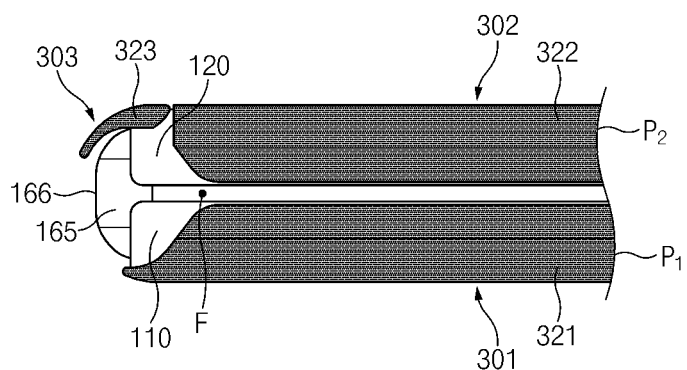

FIGS. 7A, 7B and 7C are a view illustrating core layers depending on states of the protective cover according to an embodiment. FIGS. 7A, 7B and 7C are a side view in which the fabric layer 310 is omitted from the protective cover illustrated in FIGS. 5A and 5B.

In an embodiment, the core layers 321, 322, and 323 may include the first core layer 321, the second core layer 322, and the third core layer 323 formed between the first core layer 321 and the second core layer 322.

In an embodiment, the first core layer 321 may surround at least a portion of the first housing 110. For example, the first core layer 321 may surround the second surface 112 and at least a portion of the first side member 113 of the first housing 110. The first core layer 321 may have a decreasing width toward the folding axis F. The first core layer 321 may extend towards the folding axis F than the second core layer 322. The first core layer 321 may maintain a constant a predetermined shape irrespective of a state of the protective cover 200.

In an embodiment, the second core layer 322 may surround at least a portion of the second housing 120. For example, the second core layer 322 may surround the fourth surface 122 and at least a portion of the second side member 123 of the second housing 120. The second core layer 322 may have a decreasing width toward the folding axis F. The second core layer 322 may also extend towards the folding axis F, but to a degree less than the first core layer 321. That is, the second core layer 322 may omit coverage of a portion of the fourth surface 122 of the second housing 120. The second core layer 322 may maintain a constant predetermined shape irrespective of a state of the protective cover 200.

In an embodiment, the third core layer 323 may be spaced apart from the first core layer 321 and the second core layer 322 by predetermined gaps. The third core layer 323 may be spaced apart from the first core layer 321 by the first gap d1 and may be spaced apart from the second core layer 322 by the second gap d2 greater than the first gap d1. In certain embodiments, the third core layer 323 may be formed in a shape corresponding to the shape of the hinge housing 165.

In an embodiment, the protective cover 200 may be configured such that the first core layer 321 and the second core layer 322 are folded relative to one another via the folding axis F disposed therebetween. The protective cover 200 may include a flat state, a folded state, and a fully folded state.

Referring to FIG. 7A, the flat state may include a state in which the second surface 112 of the first housing 110 and the fourth surface 122 of the second housing 120 face substantially a same direction. Alternatively, the flat state may include a state in which a first edge P1 of the first housing 110 and a second edge P2 of the second housing 120 are disposed at a maximum distance from one another.

Referring to FIG. 7A, the third core layer 323 may be spaced apart from the first housing 110 and the second housing 120. The third core layer 323 may be connected with the first core layer 321 and the second core layer 322 through the fabric layer 310. The third edge P3 of the third core layer 323 may be disposed on one side (e.g., the left side) with respect to the folding axis F, and a fourth edge P4 of the third core layer 323 may be located on an opposite side (e.g., the right side) with respect to the folding axis F. The third edge P3 of the third core layer 323 may be located in a higher position in the direction toward the rear surface of the electronic device than the first core layer 321 and the second core layer 322. A portion of the first core layer 321 may be disposed between the third edge P3 of the third core layer 323 and the first housing 110.

Referring to FIG. 7B, the folded state may include a state in which the second surface 112 of the first housing 110 and the fourth surface 122 of the second housing 120 form a predetermined angle. The folded state may include a state in which the hinge housing 165 is exposed to the space defined between the first housing 110 and the second housing 120.

Referring to FIG. 7B, the gap between the third core layer 323 and the first core layer 321 may be decreased as the protective cover 200 is folded. The third core layer 323 may face the outer surface of the hinge housing 165 exposed between the first housing 110 and the second housing 120. As the protective cover 200 is folded, the third edge P3 of the third core layer 323, when viewed with respect to the folding axis F, may move toward the area where the second housing 120 is located.

To distinguish the state illustrated in FIG. 7C from the state illustrated in FIG. 7B, the state illustrated in FIG. 7C may be defined as a fully folded state. The fully folded state may include a state in which the second surface 112 of the first housing 110 and the fourth surface 122 of the second housing 120 face away from each other. The fully folded state may include a state in which the first edge P1 of the first housing 110 and the second edge P2 of the second housing 120 form a minimum distance therebetween. In the fully folded state, the hinge housing 165 may be exposed to the space between the first housing 110 and the second housing 120 with a maximum area.

Referring to FIG. 7C, the third core layer 323 may be spaced a predetermined gap apart from, or brought into close contact with, the outer surface 166 of the hinge housing 165. The gap between the third core layer 323 and the hinge housing 165 may be smaller than that in the flat state or the folded state. The third core layer 323 may be disposed to have the same center of curvature as the curved area of the hinge housing 165. The third edge P3 of the third core layer 323, when viewed with respect to the folding axis F, may be located in the area where the second housing 120 is located. The third edge P3 and the fourth edge P4 of the third core layer 323 may be located in the same direction with respect to the folding axis F.

FIGS. 8A and 8B are a view illustrating a table mode of the protective cover according to an embodiment.

Referring to FIGS. 8A and 8B, the protective cover 200 may include a "table" mode. In the table mode, the protective cover 200 may be configured such that the first rear surface area 211 of the first portion 210 and the second rear surface area 221 of the second portion 220 form a specified angle therebetween. One of the first portion 210 and the second portion 220 may be disposed on a seat surface (i.e., the ground), and the other may be disposed at a specified angle with respect to the ground. In this case, the portion of the protective cover 200 disposed at the specified angle with respect to the ground may be accommodated in the space between the connecting portion 230 and the electronic device. For example, referring to the drawing, the first portion 210 may be disposed on the ground, and at least a portion of the second portion 220 may be accommodated in the space between the connecting portion 230 and the electronic device.

In certain embodiments, one of the first rigid area 301 and the second rigid area 302 of the protective cover 200 may be disposed on the ground, and the other may be disposed at a specified angle with respect to the ground. The area of the protective cover 200 disposed on the ground may be an area disposed closer to the third rigid area 303.

For example, referring to the drawing, the first rigid area 301 may be disposed parallel to the ground because the first rigid area 301 is formed closer to the third rigid area 303 than the second rigid area 302. The second rigid area 302 may be disposed to form a predetermined angle with the first rigid area 301. A portion of the second flexible area 305 may be accommodated between the second rigid area 302 and the third rigid area 303.

In certain embodiments, the third rigid area 303 may maintain the second rigid area 302 such that the second rigid area 302 connected to the third rigid area 303 by the second flexible area 305 is disposed at a specified angle with respect to the ground.

Figure 9A:
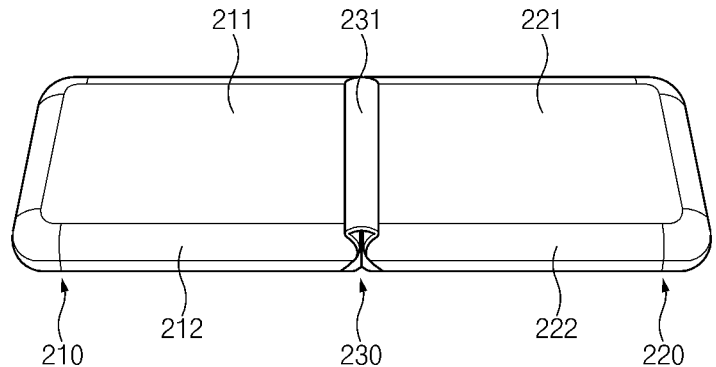
FIGS. 9A, 9B and 9C are a view illustrating a protective cover according to certain embodiments.
Figure 9B:
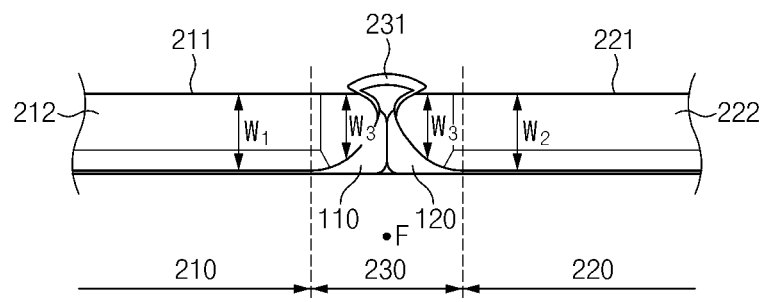
Figure 9C:
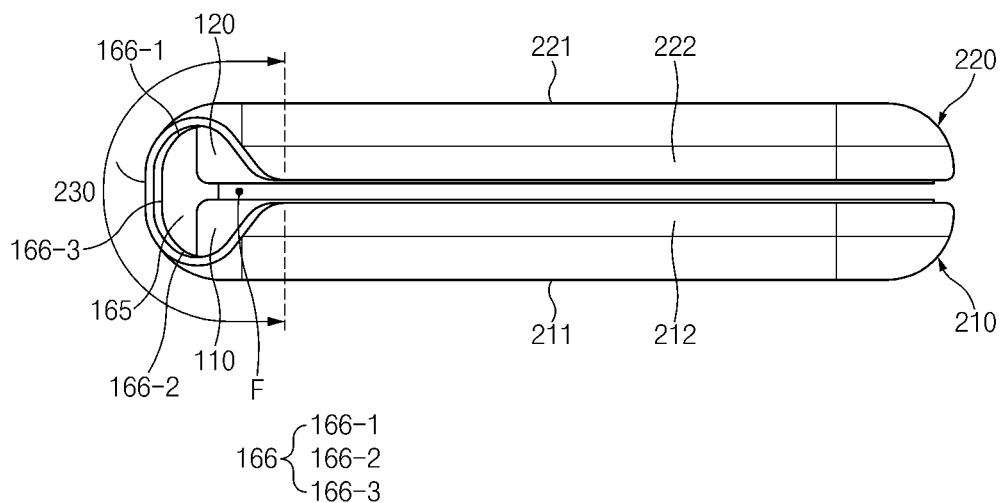

FIGS. 9A, 9B and 9C are a view illustrating a protective cover according to certain embodiments. FIG. 9A is a perspective view of the protective cover according to an embodiment. FIG. 9B is a side view of the protective cover in a flat state. FIG. 9C is a side view of the protective cover in a folded state.

In an embodiment, the protective cover 200 may include a first portion 210 coupled to at least a portion of the first housing 110 of the electronic device, a second portion 220 coupled to at least a portion of the second housing 120 of the electronic device, and a connecting portion 230 formed between the first portion 210 and the second portion 220.

In an embodiment, the first portion 210 may include a first rear surface area 211 coupled to at least a portion of the second surface 112 of the first housing 110 and a first side surface area 212 coupled to at least a portion of the first side member 113 of the first housing 110. The first rear surface area 211 of the first housing 110 may be formed to be substantially flat. The first side surface area 212 may curvedly extend from the first rear surface area 211. The first portion 210 may be coupled with the first housing 110 such that the first rear surface area 211 and the first side surface area 212 are brought into close contact with the second surface 112 of the first housing 110 and the first side member 113 of the first housing 110, respectively. In certain embodiments, the first rear surface area 211 and the first side surface area 212 are not limited to the shapes illustrated in the drawing and may be formed to be flat and/or curved to correspond to the shape of the first housing 110 of the electronic device.

In an embodiment, the second portion 220 may include a second rear surface area 221 coupled to at least a portion of the fourth surface 122 of the second housing 120 and a second side surface area 222 coupled to at least a portion of the second side surface 123 of the second housing 120. The second rear surface area 221 may be formed to be substantially flat. The second side surface area 222 may curvedly extend from the second rear surface area 221. The second portion 220 may be coupled with the second housing 120 such that the second rear surface area 221 and the second side surface area 222 are brought into close contact with the fourth surface 122 of the second housing 120 and the second side surface 123 of the second housing 120. In certain embodiments, the second rear surface area 221 and the second side surface area 222 are not limited to the shapes illustrated in the drawing and may be formed to be flat and/or curved to correspond to the shape of the second housing 120 of the electronic device.

In an embodiment, the connecting portion 230 may include a third rear surface area 231 formed between the first rear surface area 211 and the second rear surface area 221, and a third side surface area 232 formed between the first side surface area 212 and the second side surface area 222. The connecting portion 230 may have a smaller width than the first portion 210 and the second portion 220. For example, the connecting portion 230 may include a structure extending from the first portion 210, such that the width is decreased from the first portion 210 toward the second portion 220. The connecting portion 230 may also include a structure extending from the second portion 220, such that the width is decreased from the second portion 220 toward the first portion 210. For example, the third side surface area 232 may have a width W3 smaller than the width W1 of the first side surface area 212 and/or the width W2 of the second side surface area 222.

Referring to FIGS. 9A and 9B, the protective cover 200 may be configurable so as to be disposed in a flat state and a folded state, according to a state in which the electronic device (to which the protective cover 200 is attached) is disposed. The flat state may include a state in which the hinge housing 165 of the mounted electronic device is not exposed. The flat state may include a state in which the first rear surface area 211 and the second rear surface area 221 face the same direction. The folded state may include a state in which the hinge housing 165 of the mounted electronic device is exposed between the first housing 110 and the second housing 120. The folded state may include a state in which the first rear surface area 211 and the second rear surface area 221 form a predetermined angle therebetween. For example, the folded state may include a fully folded state (e.g., FIG. 9C) in which the first rear surface area 211 and the second rear surface area 221 face away from each other.

In the flat state, as illustrated in FIG. 9B, at least a portion of the connecting portion 230 may be spaced apart from the first housing 110 and the second housing 120, and may not make physical contact with the first housing 110 and the second housing 120. For example, the central area of the connecting portion 230 may be spaced apart from the first housing 110 and the second housing 120, and the areas on the opposite sides of the central area may be brought into physical contact with the first housing 110 and the second housing 120.

In the folded state illustrated in FIG. 9C, the connecting portion 230 may face the hinge housing 165 of the electronic device. The outer surface 166 of the hinge housing 165 may include the first curved area 166-1 adjacent to the first housing 110, the second curved area 166-2 adjacent to the second housing 120, and the flat area 166-3 that is formed between the first curved area 166-1 and the second curved area 166-2. In this case, the connecting portion 230 may be formed in a shape corresponding to the outer surface 166 of the hinge housing 165. For example, the inner surface of the connecting portion 230 may be brought into close contact with, or spaced by a predetermined gap apart from, the outer surface 166 of the hinge housing 165.

Figure 10A:
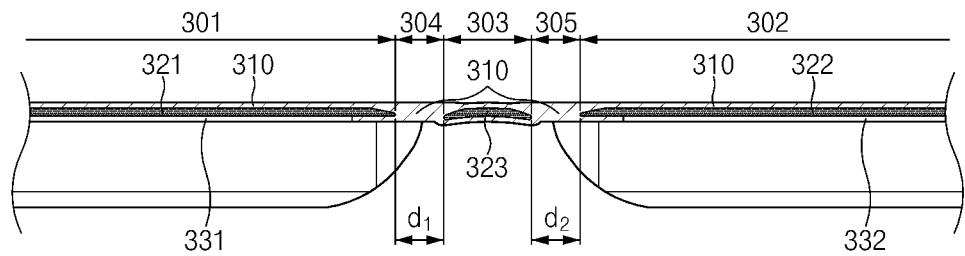
FIGS. 10A, 10B and 10C are a sectional view of the protective cover according to certain embodiments.
Figure 10B:
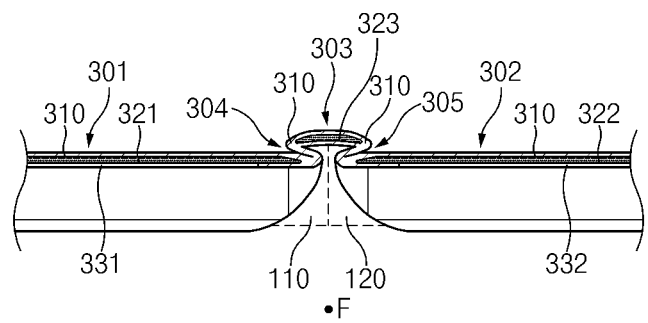
Figure 10C:
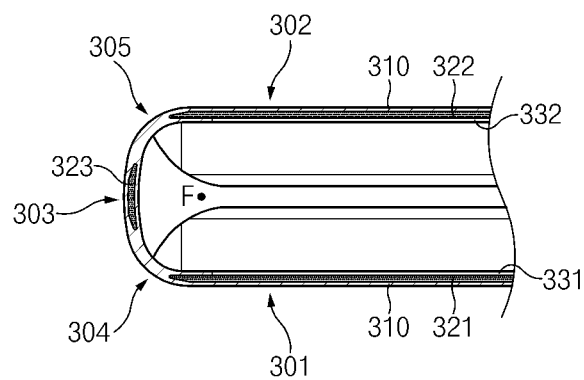

FIGS. 10A, 10B and 10C are a sectional view of the protective cover according to certain embodiments. FIG. 10A is a view illustrating a flat state of the protective cover in which the electronic device is not mounted. FIG. 10B is a view illustrating a flat state of the protective cover in which the electronic device is mounted. FIG. 10C is a view illustrating a folded state of the protective cover in which the electronic device is mounted.

In an embodiment, the protective cover 200 may include a fabric layer 310, core layers 321, 322, and 323, and adhesive layers 331 and 332. The fabric layer 310 may be integrally formed in rigid areas 301, 302, and 303 and flexible areas 304 and 305. The core layers 321, 322, and 323 may include the first core layer 321 included in the first rigid area 301, the second core layer 322 included in the second rigid area 302, and the third core layer 323 included in the third rigid area 303. The adhesive layers 331 and 332 may include the first adhesive layer 331 included in the first rigid area 301 and the second adhesive layer 332 included in the second rigid area 302.

In an embodiment, the first rigid area 301 may substantially surround the second surface (e.g., the second surface 112 of FIG. 1) and the first side surface (e.g., the first side member 113 of FIG. 1) of the first housing 110. The first rigid area 301 may retain a same predetermined shape in both the flat state and the folded state. The first rigid area 301 may include the fabric layer 310, the first core layer 321 at least partially surrounded by the fabric layer 310, and the first adhesive layer 331 attached to the electronic device. The fabric layer 310 may form the outer surface of the first rigid area 301. The fabric layer 310, together with the first adhesive layer 331, may form the inner surface of the first rigid area 301. The first core layer 321 may be formed of a rigid material such that the first rigid area 301 maintains a constant shape. The first core layer 321 may be spaced apart from the third core layer 323 and the second core layer 322 by predetermined gaps. The first core layer 321 may be spaced apart from the third core layer 323 by a first gap d1.

In an embodiment, the second rigid area 302 may substantially surround the fourth surface (e.g., the fourth surface 122 of FIG. 1) and the second side surface (e.g., the second side member 123 of FIG. 1) of the second housing 120. The second rigid area 302 may remain in a constant predetermined shape in the flat state and the folded state. The second rigid area 302 may include the fabric layer 310, the second core layer 322 at least partially surrounded by the fabric layer 310, and the second adhesive layer 332 attached to the electronic device. The fabric layer 310 may form the outer surface of the second rigid area 302. The fabric layer 310, together with the second adhesive layer 332, may form the inner surface of the second rigid area 302. The second core layer 322 may be formed of a rigid material such that the second rigid area 302 maintains a constant shape. The second core layer 322 may be spaced apart from the third core layer 323 and the first core layer 321 by predetermined gaps. The second core layer 322 may be spaced apart from the third core layer 323 by a second gap d2.

In an embodiment, the third rigid area 303 may be formed between the first flexible area 304 and the second flexible area 305. The third rigid area 303 may remain constant in a predetermined shape, in both the flat state and the folded state. In the folded state, at least a portion of the third rigid area 303 may be disposed so as to face the outer surface of the hinge housing (e.g., the hinge housing 165 of FIG. 9). The third rigid area 303 may include the fabric layer 310 and the third core layer 323 surrounded by the fabric layer 310. The fabric layer 310 may form the outer surface and the inner surface of the third rigid area 303. The third core layer 323 may be formed of a rigid material such that the third rigid area 303 maintains a constant shape. The third core layer 323 may be spaced apart from the first core layer 321 by the first gap d1 and may be spaced apart from the second core layer 322 by the second gap d2 equal to the first gap d1.

Unlike the third core layer illustrated in FIG. 6, the third core layer 323 illustrated in FIG. 10 may have a third edge P3 and a fourth edge P4 located on the opposite sides with respect to the folding axis in the flat state and the folded state.

In certain embodiments, the third core layer 323 may be curved so as to correspond to a portion (e.g., the curved areas 166-1 and 166-2 of FIG. 9) of the hinge housing (e.g., the hinge housing 165 of FIG. 9) and may face a flat area (e.g., 166-3) of the hinge housing.

In an embodiment, the first flexible area 304 may be formed between the first rigid area 301 and the third rigid area 303. The first flexible area 304 may include the fabric layer 310, but may omit the core layer. For example, the first flexible area 304 may be formed of the fabric layer 310 without the core layer. The first flexible area 304 may be bent depending on a change of state of the protective cover 200 to change the position of the third rigid area 303 relative to the first rigid area 301. For example, when viewed in the flat state, the first flexible area 304 may be bent such that the third rigid area 303 further protrudes beyond the first rigid area 301 or the second rigid area 302 in the direction toward the rear surface of the protective cover 200. For example, in the folded state, the first flexible area 304 may be bent such that a portion of the third rigid area 303 faces the outer surface of the hinge housing with a predetermined gap therebetween or is brought into close contact with the outer surface of the hinge housing.

In certain embodiments, when the rear surface of the protective cover 200 is viewed from above, the first flexible area 304 and the second flexible area 305 may have substantially the same area. In certain embodiments, the first flexible area 304 may be bent at least once when the electronic device is disposed in the flat state (FIG. 9B).

In an embodiment, the second flexible area 305 may be formed between the second rigid area 302 and the third rigid area 303. The second flexible area 305 may include the fabric layer 310, but may not include a core layer. For example, the second flexible area 305 may be formed of the fabric layer 310. The second flexible area 305 may be bent depending on a change of state of the protective cover 200 to change the position of the third rigid area 303 relative to the second rigid area 302. For example, when viewed in the flat state, the second flexible area 305 may be bent, such that the third rigid area 303 further protrudes beyond the first rigid area 301 or the second rigid area 302 in the direction toward the rear surface of the protective cover 200 (e.g., upward based on the drawing). For example, in the folded state, the second flexible area 305 may be bent such that a portion of the third rigid area 303 faces the outer surface of the hinge housing with a predetermined gap therebetween or is brought into close contact with the outer surface of the hinge housing.

In certain embodiments, when the rear surface of the protective cover 200 is viewed from above, the second flexible area 305 may have substantially the same area as the first flexible area 304. In certain embodiments, the second flexible area 305 may be bent at least once in the flat state (FIG. 9B) in which the electronic device is mounted.

In certain embodiments, unlike those illustrated in FIG. 6, the first flexible area 304 and the second flexible area 305 may be bent two or more times, as compared with when the protective cover is disposed in the flat state while the electronic device is not mounted. In certain embodiments, unlike those illustrated in FIG. 6, the first flexible area 304 and the second flexible area 305 may be bent to be symmetrical to each other with respect to the folding axis F.

In certain embodiments, in the flat state (FIG. 9B) in which the electronic device is mounted, the first flexible area 304 may be disposed in the space between the first rigid area 301 and the third rigid area 303. In the flat state (FIG. 9B) in which the electronic device is mounted, the second flexible area 305 may be located in the space between the second rigid area 302 and the third rigid area 303.

A protective cover for protecting an electronic device according to embodiments of the disclosure may include a first portion coupled to at least a portion of a first housing of the electronic device, a second portion coupled to at least a portion of a second housing of the electronic device, and a connecting portion that covers at least a portion of a hinge housing of the electronic device and that is formed between the first portion and the second portion, the hinge housing being connected with the first housing and the second housing such that the first housing and the second housing are folded with a folding axis therebetween. The connecting portion may include a core layer, at least a portion of which has a curvature corresponding to a curved area of the hinge housing.

In certain embodiments, the protective cover may include a fabric layer having the core layer disposed therein. The core layer may include a first core layer disposed inside the first portion, a second core layer disposed inside the second portion, and a third core layer disposed inside the connecting portion. The third core layer may be spaced apart from the first core layer by a first gap and may be spaced apart from the second core layer by a second gap.

In certain embodiments, the first gap may be smaller than the second gap.

In certain embodiments, the first gap may be substantially the same as the second gap.

In certain embodiments, the third core layer may extend in a direction of the folding axis.

In certain embodiments, at least a portion of the third core layer may be formed in a shape corresponding to a shape of the hinge housing.

In certain embodiments, the fabric layer forms at least a portion of a surface of the protective cover.

In certain embodiments, the first portion may include a first suction area that forms a surface of the protective cover and provides an adhesion force to at least a portion of the first housing, and the second portion may include a second suction area that forms a surface of the protective cover and provides an adhesion force to at least a portion of the second housing.

In certain embodiments, the core layer included in the connecting portion may have a smaller area than the curved area of the hinge housing.

In certain embodiments, the electronic device is deformable into a flat state in which the hinge housing is accommodated in the first housing and the second housing and a folded state in which at least a portion of the hinge housing forms an exterior of the electronic device. The protective cover is configured to be partially deformed in shape according to a state deformation of the electronic device, and a gap between the hinge housing and the third core layer is formed to be a third gap in the folded state and formed to be a forth gap greater than the third gap in the flat state.

In certain embodiments, the connecting portion may include a first edge to which the first portion is connected, a second edge to which the second portion is connected, and a central axis being a center between the first edge and the second edge. The connecting portion may be formed to have a decreasing width from the first edge and the second edge toward the central axis.

A protective cover for an electronic device according to embodiments of the disclosure may include a first rigid area attached to one portion of the electronic device, a second rigid area attached to another portion of the electronic device, a third rigid area formed between the first rigid area and the second rigid area, a first flexible area that connects the first rigid area and the third rigid area, and a second flexible area that connects the second rigid area and the third rigid area.

In certain embodiments, the first flexible area and the second flexible area may be configured such that the first rigid area and the second rigid area are folded with a folding axis therebetween. The protective cover may include a first edge parallel to the folding axis and a second edge that faces the first edge. The protective cover may include a flat state in which the first edge and the second edge have a maximum distance therebetween and a folded state in which the first edge and the second edge have a minimum distance therebetween. The first flexible area may be configured such that at least a portion thereof is accommodated in a space between the first rigid area and the third rigid area in the flat state.

In certain embodiments, the third rigid area may include a first edge connected with the first flexible area and a second edge connected with the second flexible area. The third rigid area may be formed such that the first edge and the second edge are located on one side of the folding axis in the folded state, the first edge is located on the one side of the folding axis in the flat state, and the second edge is located on an opposite side of the folding axis in the flat state.

In certain embodiments, the protective cover may include a core layer and a fabric layer that surrounds at least a portion of the core layer. The core layer may include a first core layer included in the first rigid area, a second core layer included in the second rigid area, and a third core layer included in the third rigid area. The third core layer may be spaced apart from the first core layer by a first gap and may be spaced apart from the second core layer by a second gap.

In certain embodiments, the first gap may differ from the second gap.

In certain embodiments, the core layer may be formed of at least one of polycarbonate, urethane, wood, or metal.

In certain embodiments, the protective cover includes an adhesive layer attached to a surface of the electronic device, and the adhesive layer may include a first adhesive layer included in the first rigid area and a second adhesive layer included in the second rigid area.

In certain embodiments, the first adhesive layer and the second adhesive layer, together with the fabric layer, may form a portion of an inner surface of the protective cover.

In certain embodiments, the adhesive layer may include a suction pad that provides an adhesion force.

It should be appreciated that certain embodiments of the disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar components. It is to be understood that a singular form of a noun corresponding to an item may include one or more of the things, unless the relevant context clearly indicates otherwise. As used herein, each of such phrases as "A or B," "at least one of A and/or B," "A, B, or C," and "at least one of A, B, and/or C" may include any one of, or all possible combinations of the items enumerated together in a corresponding one of the phrases. As used herein, such terms as "1st" and "2nd," or "first" and "second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

According to the situation, the expression "adapted to or configured to" used in this disclosure may be used interchangeably with, for example, the expression "suitable for", "having the capacity to", "adapted to", "made to", "capable of", or "designed to" in hardware or software. The expression "a device configured to" may mean that the device is "capable of" operating together with another device or other components. For example, a "processor set to (or configured to) perform A, B, and C" may mean a dedicated processor (e.g., an embedded processor) for performing corresponding operations or a generic-purpose processor (e.g., a CPU or an AP) that performs corresponding operations by executing one or more programs stored in a memory device (e.g., memory).

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. The "module" may be implemented mechanically or electronically and may include, for example, an application-specific integrated circuit (ASIC) chip, field-programmable gate arrays (FPGAs), or a programmable-logic device for performing some operations, which are known or will be developed.

At least a part of an apparatus (e.g., modules or functions thereof) or a method (e.g., operations) according to certain embodiments may be implemented by instructions stored in computer-readable storage media (e.g., memory) in the form of a program module. The instructions, when executed by a processor (e.g., a processor), may cause the processor to perform functions corresponding to the instructions. The computer-readable storage media may include a hard disk, a floppy disk, a magnetic media (e.g., a magnetic tape), an optical media (e.g., CD-ROM, DVD, magneto-optical media (e.g., a floptical disk)), an embedded memory, and the like. The instructions may include a code made by a compiler or a code executable by an interpreter.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

What is claimed is:

1. A protective cover for an electronic device, the protective cover comprising:
a first portion configured to couple to at least part of a first housing of the electronic device;
a second portion configured to couple to at least part of a second housing of the electronic device;
a connecting portion configured to cover at least part of a hinge housing of the electronic device, the connecting portion formed between the first portion and the second portion; and
a fabric layer in which a core layer is disposed,
wherein the hinge housing is connected with the first housing and the second housing such that the first housing and the second housing are foldable according to a folding axis formed therebetween, wherein the core layer includes a first core layer disposed within the first portion, a second core layer disposed within the second portion, and a third core layer disposed within the connecting portion, wherein the third core layer is spaced apart from the first core layer by a first gap, and spaced apart from the second core layer by a second gap, and at least a portion of which has a curvature corresponding to a curved area of the hinge housing.

2. The protective cover of claim 1, wherein the first gap is smaller than the second gap.

3. The protective cover of claim 1, wherein the first gap is substantially the same as the second gap.

4. The protective cover of claim 1, wherein the third core layer extends in a direction of the folding axis.

5. The protective cover of claim 1, wherein at least a portion of the third core layer is formed in a shape corresponding to a shape of the hinge housing.

6. The protective cover of claim 1, wherein the fabric layer forms at least a portion of a surface of the protective cover.

7. The protective cover of claim 1, wherein the first portion includes a first suction area forming a first part of a surface of the protective cover and providing an adhesion force to at least the part of the first housing, and wherein the second portion includes a second suction area forming a second part of the surface of the protective cover and providing an adhesion force to at least the part of the second housing.

8. The protective cover of claim 1, wherein the third core layer included in the connecting portion defines an area smaller than an area of a curved portion of the hinge housing.

9. The protective cover of claim 1, wherein the electronic device is deformable into:

a flat state in which the hinge housing is stowed within the first housing and the second housing, and a folded state in which at least a portion of the hinge housing forms an exterior of the electronic device, wherein the protective cover is at least partially deformable according to a present deformation of the electronic device, and a third gap is defined between the hinge housing and the third core layer, wherein the third gap spans a first distance in the folded state, and a second distance in the flat state, in which the second distance is greater than the first distance.

10. The protective cover of claim 1, wherein the connecting portion includes a first edge to which the first portion is connected, a second edge to which the second portion is connected, and a central axis defining a center between the first edge and the second edge, and wherein a width of connecting portion decreases from the first edge and the second edge towards the central axis.

11. A protective cover for an electronic device, the protective cover comprising:

a first rigid area configured to attach to at least part of a first housing of the electronic device;

a second rigid area configured to attach to at least part of a second housing of the electronic device;

a third rigid area configured to cover at least part of a hinge housing of the electronic device, the third rigid area formed between the first rigid area and the second rigid area;

a first flexible area connecting the first rigid area and the third rigid area;

a second flexible area connecting the second rigid area and the third rigid area;

a core layer; and a fabric layer configured to surround at least a portion of the core layer, wherein the hinge housing is connected with the first housing and the second housing such that the first housing and the second housing are foldable according to a folding axis formed therebetween, wherein the core layer includes a first core layer included in the first rigid area, a second core layer included in the second rigid area, and a third core layer included in the third rigid area, and wherein the third core layer is spaced apart from the first core layer by a first gap, and spaced apart from the second core layer by a second gap.

12. The protective cover of claim 11, wherein the first rigid area and the second rigid area are foldable relative to one another along a folding axis disposed therebetween, wherein the protective cover includes a first edge disposed parallel to the folding axis and a second edge disposed facing away from the first edge when the first rigid area and the second rigid area are unfolded relative to one another along the folding axis, wherein the protective cover is deformable into at least a flat state in which the first edge and the second edge are set at a maximum distance apart from each other, and a folded state in which the first edge and the second edge are set at a minimum distance apart from each other, and wherein, in the flat state, at least a portion of the first flexible area is housed in a space defined between the first rigid area and the third rigid area.

13. The protective cover of claim 1, wherein the third rigid area includes a first edge connected with the first flexible area, and a second edge connected with the second flexible area, and wherein the third rigid area is formed such that:

in the folded state, the first edge and the second edge are located on one side of the folding axis, and in the flat state, the first edge is located on the one side of the folding axis and the second edge is located on an opposite side of the folding axis.

14. The protective cover of claim 11, wherein the first gap is different in size from the second gap.

15. The protective cover of claim 11, wherein the core layer includes at least one of polycarbonate, urethane, wood, or metal.

16. The protective cover of claim 11, wherein the protective cover includes an adhesive layer configured to attach to a surface of the electronic device, and wherein the adhesive layer includes a first adhesive layer included in the first rigid area, and a second adhesive layer included in the second rigid area.

17. The protective cover of claim 16, wherein the first adhesive layer and the second adhesive layer form a portion of an inner surface of the protective cover together with the fabric layer.

18. The protective cover of claim 16, wherein the adhesive layer includes a suction pad configured to provide an adhesion force.

* * * * *